(12) United States Patent
Benveniste

(10) Patent No.: US 6,207,963 B1
(45) Date of Patent: Mar. 27, 2001

(54) ION BEAM IMPLANTATION USING CONICAL MAGNETIC SCANNING

(75) Inventor: Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/219,669

(22) Filed: Dec. 23, 1998

(51) Int. Cl.[7] .................... H01J 37/317; H01J 37/147
(52) U.S. Cl. ................. 250/492.21; 250/423 R; 250/396 R; 250/281; 313/361.1
(58) Field of Search .................... 250/492.21, 423 R, 250/396 R, 281; 313/359.1, 361.1

(56) References Cited

U.S. PATENT DOCUMENTS

| | | | |
|---|---|---|---|
| 4,804,852 | * 2/1989 | Rose | 250/492.21 |
| 5,373,164 | 12/1994 | Benveniste | 250/492.21 |
| 5,554,853 | * 9/1996 | Rose | 250/492.21 |
| 5,554,857 | 9/1996 | Benveniste | 250/492.21 |

* cited by examiner

Primary Examiner—Jack Berman
Assistant Examiner—Nikita Wells
(74) Attorney, Agent, or Firm—Watts, Hoffman, Fisher & Heinke

(57) ABSTRACT

Method and apparatus for use in treating a workpiece implantation surface by causing ions to impact the workpiece implantation surface. Ions emitted by an ion source are accelerated away from the ion source to form an ion beam. A magnetic field is created for intercepting the ions in the ion beam exiting the source and selectively deflectiing the ions away from an initial trajectory in a generally arcuate scanning motion. The magnetic field is created by synchronized energization of first and second current carrying coils located along an inner surface of a ferromagnetic support. The beam is deflected away from the initial trajectory by a controlled amount in a time varying manner to cause the beam to sweep through an arcuate path and impact the workpiece.

12 Claims, 3 Drawing Sheets

ION BEAM IMPLANTATION USING CONICAL MAGNETIC SCANNING

FIELD OF THE INVENTION

The present invention concerns a workpiece treatment system that uses positively charged ions for treating a workpiece. Such a system includes an ion source and structure for moving ions from the source to an implant station where target workpieces are situated for ion beam treatment.

BACKGROUND ART

One commercially available ion implantation system uses an ion source spaced from an implantation chamber where one or more workpieces are treated by ions from the source. An exit opening in an ion generation chamber allows ions to exit the source so they can be shaped, analyzed, and accelerated to form an ion beam. The ion beam is directed along an evacuated beam path to the ion implantation chamber where the ion beam strikes one or more workpieces, typically generally circular wafers. The energy of the ion beam is sufficient to cause ions which strike the wafers to penetrate those wafers in the implantation chamber. In a typical application of such a system the wafers are silicon wafers and the ions are used to "dope" the wafers to create a semiconductor material. Selective implantation with the use of masks and passivation layers allows an integrated circuit to be fabricated.

In a so-called medium current implanter, wafers are treated one at a time by placing them at an implant station and scanning an ion beam across a wafer surface along a controlled path. The scanning motion is applied by a scanning electrode that sets up an electrostatic field for deflecting the ions in the ion beam along controlled paths.

U.S. Pat. No. 5,373,164 to Benveniste, which issued from the United States Patent and Trademark Office on Dec. 13, 1994 concerns such a medium current implanter. An ion implanation system disclosed in the '164 patent includes structure to create a dipole field through which the ion beam passes. The strength and direction of the dipole field is controlled to adjust an angle of impact between the workpiece, typically a silicon wafer and the ion beam. A side-to-side scanning motion is used to provide controlled doping of an entire silicon wafer.

The technique disclosed in the '164 patent will not work for controlled deflection of the ion beam used to treat multiple wafers used with a high current implanter. Such an implanter is disclosed in U.S. Pat. No. 5,554,857 which is assigned to Eaton Corporation and which is incorporated herein by reference. Electric scanning such as the scanning disclosed in the '164 patent is not suitable since the electric field used to produce the side to side scanning tends to de-stabilize the background neutralization that allows high current beam transport.

DISCLOSURE OF THE INVENTION

An ion implanter constructed in accordance with the present invention includes an ion source that emits ions which traverse an ion beam travel path to an implantation chamber mounted in spaced relation to the ion source. A magnet that is positioned along the ion beam path between the ion source and the implantation chamber deflects ions through a controlled scan angle away from an entrance trajectory as the ion beam enters the magnet. While the amount of this deflection is generally fixed, the direction of deflection is controlled to cause the ion beam to sweep through an arcuate path. This controlled scanning can be used, for example, to scan the ion beam over an implant surface of a workpiece that is supported within the ion implantation chamber.

An exemplary magnet includes a coil support constructed from a ferromagnetic material that extends along a portion of the beam path. One or more coils carried by the coil support create a deflecting magnetic field that intercepts the ion beam in a deflection region bounded by the coil support. To achieve controlled deflection of the ion beam a controller electrically coupled to the one or more current carrying coils energizes the current carrying coils to create a magnetic field that scans the beam along the controlled scan angle. A result of this controlled deflection is to cause the ions in the beam to strike the workpieces at a time varying location on a wafer support.

These and other objects, advantages and features of the invention are described in greater detail in conjunction with the accompanying drawings.

BEST MODE FOR PRACTICING THE INVENTION

Figure 1:
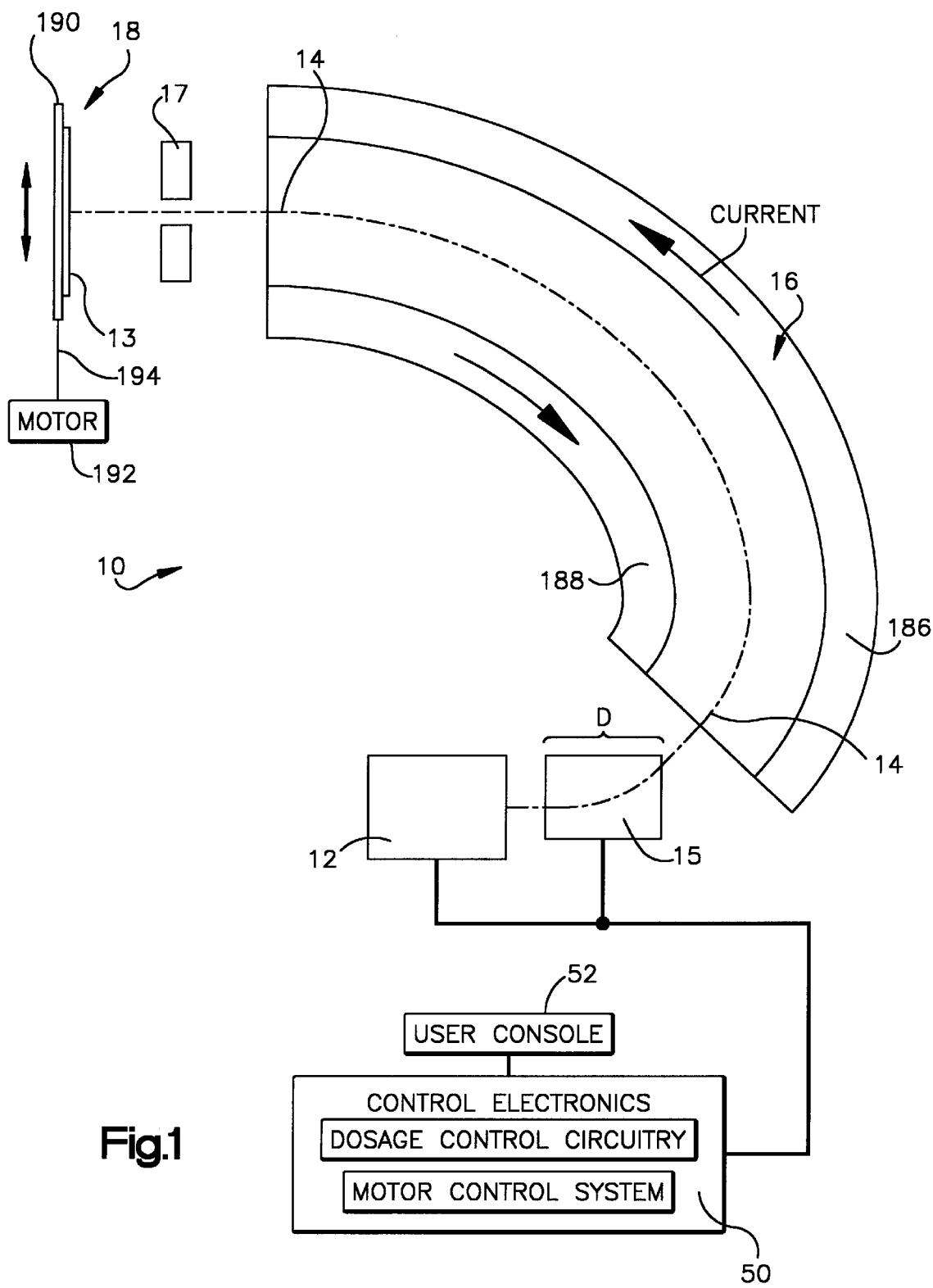
FIG. 1 is a scehematic depiction of an ion implanter constructed in accordance with the invention.

FIG. 1 depicts a relatively low energy, high current ion implanter 10 wherein ions are extracted from an ion source 12 to impact workpieces 13 at a workstation. A beamline assembly guides an ion beam 14 from the source 12 through a beam deflector or rotator 15 to a collimator magnet 16. The magnet 16 bends the beam 14 through a 180 degree deflection from an initial beam direction to a resolving slit 17 and into an implantation chamber 18. The ion source 12 and the beam deflector 15 along with their respective power supplies, are supported within an implanter housing. The ion implanter 10 is a low energy implanter which operates with implant energies of a range 0.2–90 kev and supplies beam currents of about 10 milliamps. The travel path from the source 12 to the implantation chamber 18 is kept relatively short to reduce problems in beam transport due to a tendency of a low energy beam to diffuse (i.e. blow up) during propagation of the beam from the ion source 12 to the implantation chamber 18.

The ion source 12 includes a plasma chamber in which ions are created. An ionizable dopant gas is injected into the plasma chamber. Typical source elements are gaseous florides of boron (B), phosphorous (P), and arsenic (As). Energy is transferred to the ionizable dopant gas to generate ions within the plasma chamber. Generally, positive ions are generated, although the present invention is applicable to systems wherein negative ions are generated by the source. The positive ions are extracted through apertures in the plasma chamber by an ion extractor assembly which includes a plurality of electrodes that are charged with negative potential voltages, increasing in magnitude as the distance from the plasma chamber slit increases. Electric fields set up by these electrodes extract ions to form the beam 14. The electrodes also accelerate the extracted ions into the magnetic deflector 15.

A control system 50 including one or more programmable controllers presents ion implantation information on a user display or console 52. The control system 50 also is responsible for control beam dose by control over the ion source and movement of a workpiece within the implantation chamber 18. Beam scanning is also performed by the control system by adjusting the magnetic field strength created by the magnetic deflector 15.

A preferred beam deflector 15 (FIG. 2) deflects the beam to achieve azimuthal scanning of the ion beam. This scanning is similar to the scanning achieved by creation of an electrostatic field in the '164 patent to Benveniste. The beam deflector 15 redirects the beam away from its initial trajectory to a deflected direction by an amount and to a direction that can be adjusted based upon energization current passing through two coils 110, 112. In accordance with an exemplary embodiment of the invention the two coils 110, 112 are supported by a steel yoke 120. The coils 110, 112 are wound lengthwise to extend along inside, generally planar surfaces S of the yoke 120. The yoke 120 extends a distance D (FIG. 1) along the beam path so that each strand of the mult-strand coil 110, for example, also extends this distance D along the beam path.

Figure 2:
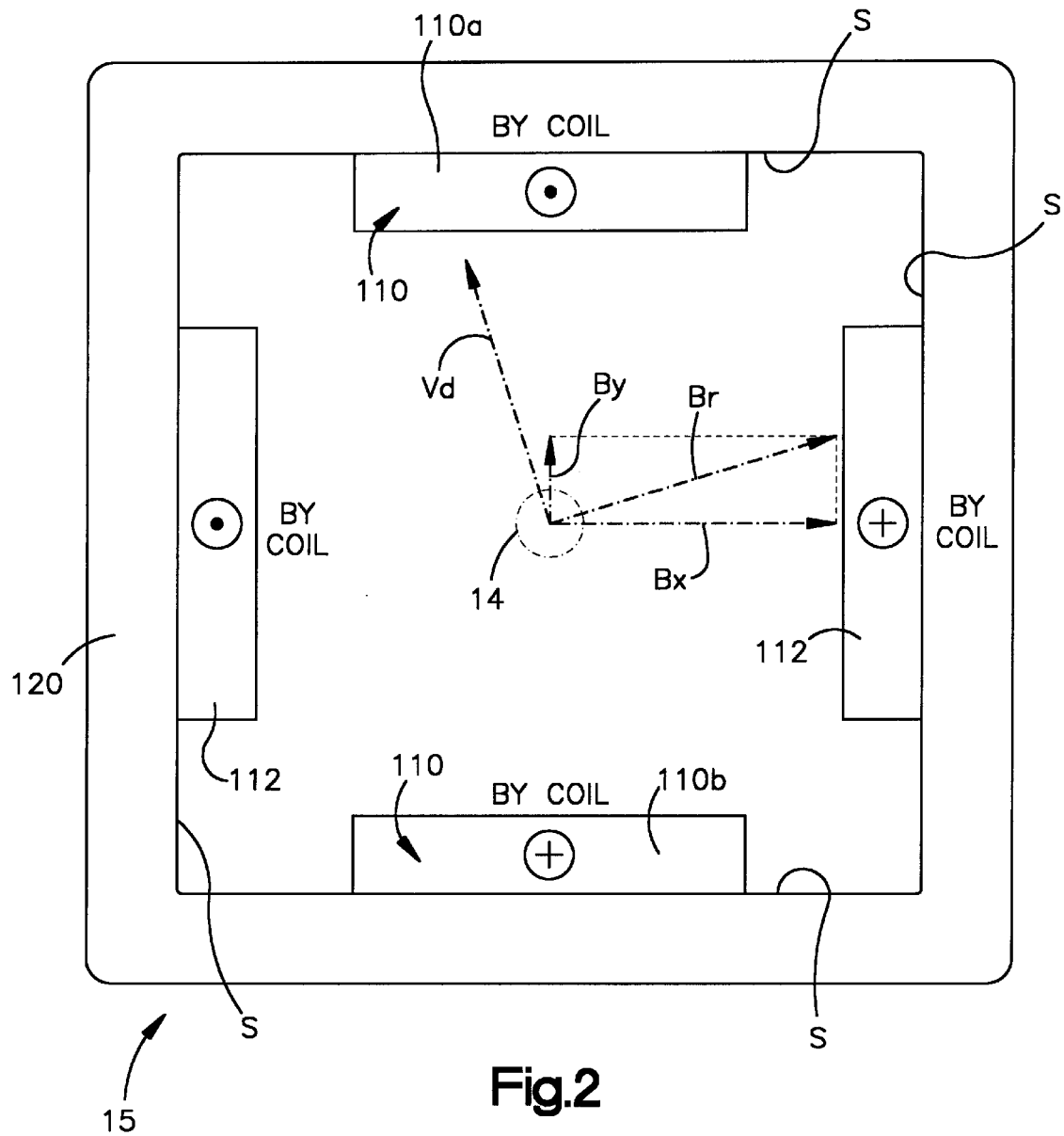
FIGS. 2 and 3 illustrate alternate structures for magnetically scanning the ion beam emitted from a source to a target location in an implantation chamber.

The coils 110, 112 are wound so that current carried by the coils moves in a direction generally parallel to an entrance trajectory that the ions follow as they leave the source 12 to enter the deflector 15. The coils are wound back and forth along the planar yoke surfaces S so the current flows in opposite directions on opposite sides of the beam. In the illustatration of FIG. 2 an upper portion 110a of the coil 110 has strands carrying current into the plane of the figure and a lower portion 110b of the coil 110 has strands carrying current out of the plane of the figure.

When energized by a voltage source that forms a part of the control 50, the current in the two coils 110, 112 produces mutually orthogonal magnetic dipole fields $B_x$, $B_y$ (FIG. 2) in a region occupied by the ion beam. A resultant magnetic field $B_r$ is the vectoral sum of the two fields $B_x$, $B_y$. A charged particle (such as one of the ions in the ion beam passing through the magnetic field) will experience a force at right angles to a magnetic field through which the charged particle is moving. The strength of the force is proportional to the magnetic field strength. A vector $V_d$ in FIG. 2 illustrates a direction of beam deflection based upon coil energization that creates the field $B_r$.

By adjusting the coil energization, the voltage sources of the control 50 adjust the direction of beam deflection. The resultant magnetic field is the vectoral sum of the two generally dipole fields oriented perpendicularly to each other. The orientation of the magetic field vector $B_r$ resulting from the sum of these two generally perpendicular dipole fields is made to scan back and forth along a continuously changing arc by appropriate coordinated control of coil energization. Scanning of the magetic field vector in turn results in the deflection direction changing with time. This results in a diverging beam fanning out at a constant angle with respect to the initial trajectory of the beam 14. By controlled coil energization that changes the magnetic field direction the beam is made to follow one of many different paths all of whom are coincident with a section of a cone. The ions begin their deflection at an apex of the cone and depending on the magnetic field move toward the collimator magnet.

Figure 3:
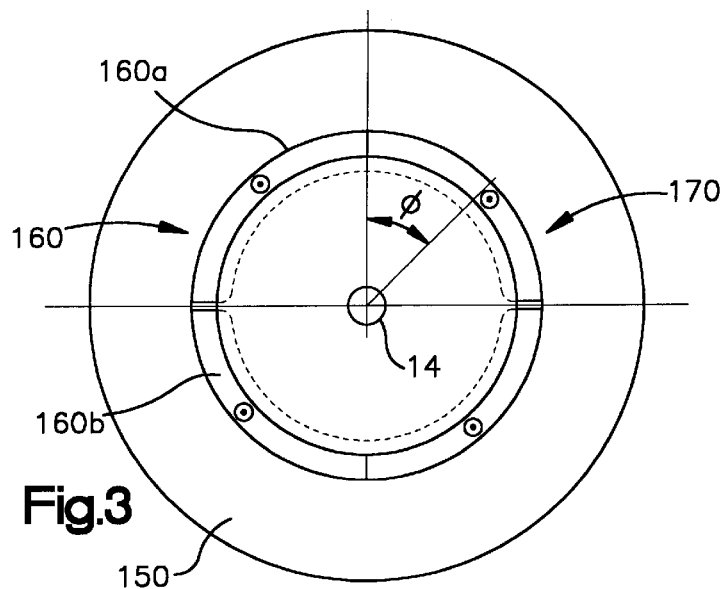
Figure 4:
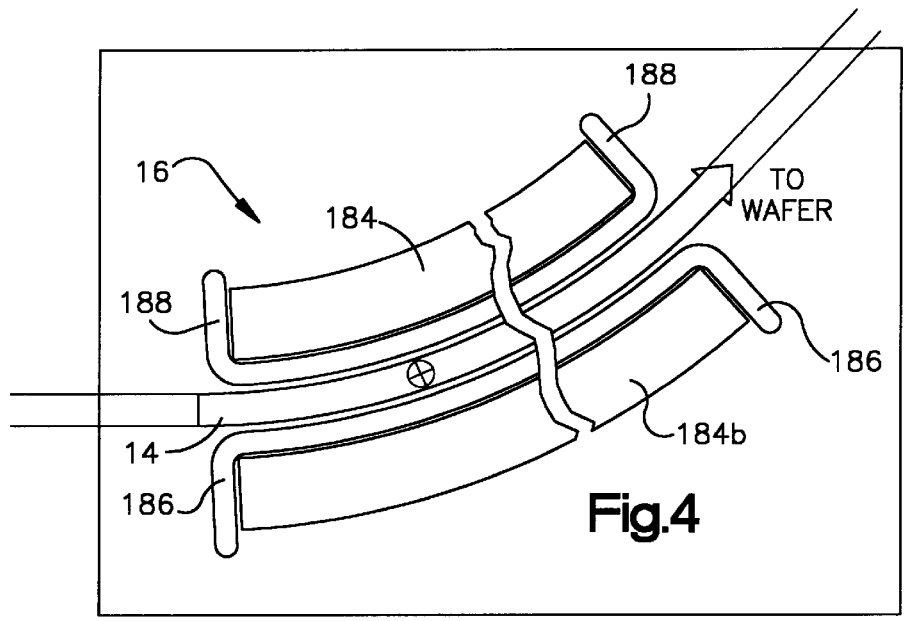
FIG. 4 is a schematic of a magnetic redeflector for redeflecting ions initially deflected by the structure illustrated in FIGS. 2 and 3.

An alternate embodiment of a beam defelector 15 is depicted in FIG. 3. In this embodiment a generally cylindrical steel yoke 150 supports two coils 160, 170. The coils 160, 170 extend along the beam path to set up dipole fields in the region bounded by the yoke 150. As was the case of the embodiment of FIG. 2 the coils extend along the beam path and carry current both into the plane (coil 160a) of the FIG. 3 depiction and out of the plane (coil 160b) of that depiction.

The coil configuration depicted in FIG. 3 provides a current density in the coils 160, 170 that produces a controlled magnetic field in the center region occupied by the beam 14. Consider a small segment of the coil 170 having current carried into the plane of the FIG. 3 depiction. This segment is offset from a top or end of the coil 170 by an angular amount $\phi$. The current through this segment produces magnetic field components $Bx=(dI)\sin\phi$ and $By=(dI)\cos\phi$, where dI is the incremental current passing through a small segment of the coil 170 in the region of $d\phi$. The field in the center of the yoke in the region of the ion beam 14 can be adjusted based on changes of the current carried by the two coils 160, 170.

When the beam 14 leaves the magnetic deflecter 15 the beam follows one of many possible diverging beam paths. The path the ion beam 14 follows at any instant as it leaves the deflector 15 is dictated by the control electronics 50 and depends on the magnetic field set up by coil energization when the ion beam passes through the deflector 15. Since the ion beam 14 follows a set of diverging ion beam paths as it exits the magnetic deflector, if the beam were to be allowed to strike a semiconductor wafer without addition deflection by the collimator magnet 16 it would strike a wafer placed in its path at many different angles (assuming the wafer has a generally planar surface).

Figure 5:
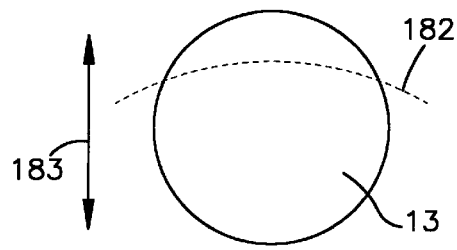
FIG. 5 is a schematic illustration of an ion beam scanning across an implantation surface of a generally circular workpiece.

FIG. 5 schematically depicts a workpiece such as a silicon wafer 13 and a desired scan path 182 the beam 14 follows across a planar surface of the wafer 13. By moving the wafer 13 up and down as indicated by an arrow 183 different portions of the wafer move through the scan path 182 to cause the entire surface of the wafer facing the ion beam 14 to be treated. As discussed below, the angle of impact between the beam and the wafer is made constant by beam redirection or focusing provided by the magnet 16. Once the control 50 has completed one implant, robotic arms (not shown) remove a treated wafer from the implantation chamber and insert a next subsequent wafer for beam treatment.

The collimator magnet 16 interposed between the magnetic deflector 15 and the implantation chamber 18, receives the beam deflected by the deflector 15 from the original extraction trajectory. The collimator magnet 16 further deflects the beam until the total angle of deflection is 180 degrees, thus parallel to the original extraction trajectory. The angle at which the beam impacts the target plane is thus constant, independently of the rotational scan position. Within the useful region where the beam is transported, the coils 186,188 and yoke (not shown) structure of the magnet is symmetrical about the original extraction axis. The coil currents flow in planes that include the original extraction axis or axis of symmetry, producing a magnetic field perpendicular to the median plane of the beam trajectory, through all rotational scan positions. At each rotational scan position, the beam propagates along a different median plane, the original extraction axis or axis of symmetry being common to all these planes. An arcuate slit 17 is interposed between the exit of the collimator and the target to intercept unwanted species that may be extracted from the ion source. (The trajectories through magnetic fields depend on the particle momentum).

The magnet 16 interposed between the magnetic deflector 15 and the implantation chamber 18 receives the deflected, diverging beam and further deflects the beam to make the diverging beams created by the magnetic deflector follow 'parallel' paths so that the ions strike the wafer 13 within the ion implantation chamber 18 at a controlled, uniform angle at all points along the scan path 182. The magnet 16 includes first and second arcuately extending yoke segments 184a, 184b that are constructed of steel. The segments 184a, 184b support a pair of coils 186, 188 that are energized to redirect the uniformly scanned ion beam 14 along a travel path through the magnet 16 that causes the beams that are deflected through diverging paths by the deflector 15 to exit the magnet 16 moving along generally parallel paths. When redirected the ions in the beam strike the workpiece at a controlled angle that is uniform across the extent of the ion beam arc 182 shown in FIG. 5.

The ion beam line from the source to the implantation station is evacuated by a vacuum pump. Although not shown in the drawings, a beam neutralizer may be interposed between the magnet and the wafer 13 to introduce electrons into the beam for avoiding potentially damaging charge build up on wafers as they are implanted within the implanation chamber 18.

Up and down scanning motion is supplied to a wafer support 190 by a motor 192 coupled to the wafer support 190 by a transmission 194. The end station 16 is pivotable along an axis which is generally perpendicular to the path of the ion beam so that the target plane of the wafer is adjustable. In this manner, the angle of ion implantation may be slightly modified from a 90 degree implant.

While the present invention has been described with a degree of particularity, it is the intent that the invention include all modifications and alterations from the disclosed design falling within the spirit or scope of the pending claims.

I claim:

1. An ion implanter having an ion source for emitting ions and an implantation chamber mounted in spaced relation to the ion source; apparatus defining an ion beam path from the ion source to the implantation chamber comprising:
   a) beam scanning structure positioned along the ion beam path between the ion source and the implantation chamber for deflecting ions by a deflection amount at a controlled scan angle with respect to an entrance trajectory followed by the ion beam as the beam enters the beam scanning structure, said beam scanning structure comprising:
      i) a support constructed from a ferromagnetic material mounted in relation to and extending along a portion of the beam path; and
      ii) one or more current carrying coils carried by the support for creating a deflecting magnetic field transverse to a direction of current through the current carrying coils, such that said magnetic field intercepts the ion beam in a deflection region bounded by the support; and
   b) a controller electrically coupled to the one or more current carrying coils that controllably energizes the current carrying coils to create a magnetic field that scans the beam in an arcuate path while maintaining the controlled scan angle to intercept different portions of a workpiece treatment zone.

2. The apparatus of claim 1 wherein the support defines an inwardly facing interior surface and wherein the one or more current carrying coils extend along the inwardly facing interior surface of the support.

3. The apparatus of claim 1 additionally comprising a collimator magnet downstream along the beam path from the beam scanning structure for controlling an angle of impact between the beam and the workpiece.

4. The apparatus of claim 3 wherein the collimator magnet sets up a static magnetic field for deflecting diverging ions.

5. The apparatus of claim 3 wherein the controller regulates a time varying coil energization scheme for scanning diverging ions in an arcuate path.

6. Apparatus comprising:
   a) an ion source for emitting ions along a controlled initial trajectory for ion treatment of a workpiece;
   b) structure defining an implantation chamber mounted in spaced relation to the ion source and including a workpiece support for positioning the workpiece for treatment by ions exiting the ion source;
   c) beam scanning structure positioned along an ion beam path between the ion source and the implantation chamber for deflecting ions by a deflection amount with respect to an entrance trajectory followed by the ion beam as the beam enters the beam scanning structure, said beam scanning structure comprising:
      i) a support constructed from a ferromagnetic material mounted in relation to and extending along a portion of the beam path; and
      ii) one or more current carrying coils carried by the support for creating a deflecting magnetic field that intercepts the ion beam in a deflection region bounded by the support; and
   d) a controller electrically coupled to the one or more current carrying coils that controllably energizes the current carrying coils to create a magnetic field that scans the beam in an arcuate path while maintaining a controlled scan angle but in different directions to intercept different portions of a workpiece treatment zone.

7. The apparatus of claim 6 additionally comprising a means to move the workpiece support along a controlled back and forth path to cause the ions to treat an entire workpiece surface.

8. The apparatus of claim 6 additionally comprising a collimator magnet for receiving ions following diverging paths from the ion beam scanning structure to deflect said ions to follow controlled paths generally parallel to each other before striking the workpiece.

9. The apparatus of claim 8 wherein the collimator magnet sets up a static magnetic field.

10. A method of ion beam treatment of a workpiece comprising the steps of:
   a) emitting ions from an ion source and accelerating the ions away from the ion source to form an ion beam; and
   b) setting up a magnetic field for intercepting the ions in the ion beam exiting the source to selectively deflect the ions making up the beam away from an initial trajectory in an arcuate scanning motion by the steps of
      i) placing first and second current carrying coils along an inner surface of a support; and
      ii) selectively energizing both the first and the second current carrying coils in a coordinated manner to deflect the beam away from the initial trajectory by a controlled amount in a time varying manner to cause the beam to sweep through an arcuate path while maintaining a controlled scan angle.

11. The method of claim 10 wherein the beam is redeflected after it is made to sweep through an arcuate path to cause the ions to impact the workpiece at a controlled angle.

12. An ion beam implant system for controllably treating a workpiece comprising:

a) source means for providing ions to treat the workpiece;

b) workpiece support means for orienting the workpiece at a target plane relative the source means;

c) beam forming means for causing ions emitted by the source means to form an ion beam moving in a first trajectory;

d) an electromagnet for deflecting ions in said ion beam away from said first trajectory by a controlled deflection angle that does not change as the workpiece is treated;

e) control means coupled to the electromagnet for applying control voltages to energize the electromagnet to cause the ion beam to scan in an arcuate path while maintaining the controlled angular deflection with respect to the first trajectory;

f) a downstream beam deflector for redeflecting the ion beam deflected by the electromagnet to the target plane; and g) scan means for translating the workpiece support means and thereby cause the ion beam to strike the workpiece at controlled regions on the workpiece surface.

* * * * *